US012597925B2

(12) United States Patent
Ballard et al.

(10) Patent No.: US 12,597,925 B2
(45) Date of Patent: Apr. 7, 2026

(54) SUPERCONDUCTING CURRENT CONTROL SYSTEM

(71) Applicant: NORTHROP GRUMMAN SYSTEMS CORPORATION, Falls Church, VA (US)

(72) Inventors: Cody James Ballard, Catonsville, MD (US); Joel D. Strand, Ellicott City, MD (US); Thomas Bernhard Chamberlin, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 685 days.

(21) Appl. No.: 18/063,518

(22) Filed: Dec. 8, 2022

(65) Prior Publication Data

US 2024/0195414 A1    Jun. 13, 2024

(51) Int. Cl.
| | |
|---|---|
| *H03K 17/92* | (2006.01) |
| *G06N 10/40* | (2022.01) |
| *H02M 3/04* | (2006.01) |

(52) U.S. Cl.
CPC ............. *H03K 17/92* (2013.01); *G06N 10/40* (2022.01); *H02M 3/04* (2013.01)

(58) Field of Classification Search
CPC ......... H03K 17/92; G06N 10/40; H02M 3/04; G01R 15/00; G01R 33/0358
See application file for complete search history.

(56) References Cited

U.S. PATENT DOCUMENTS

| | | | |
|---|---|---|---|
| 4,132,956 | A | 1/1979 | Russer |
| 4,623,804 | A | 11/1986 | Goto |
| 5,099,152 | A | 3/1992 | Suzuki |
| 5,436,451 | A | 7/1995 | Silver et al. |
| 5,936,458 | A | 8/1999 | Rylov |

(Continued)

FOREIGN PATENT DOCUMENTS

| | | |
|---|---|---|
| EP | 0467104 A2 | 1/1992 |
| EP | 0660126 A2 | 6/1995 |

(Continued)

OTHER PUBLICATIONS

Extended European Search Report (EESR) for corresponding EP Patent Application No. 23212238.2, dated Apr. 30, 2024, 7 pgs.

(Continued)

*Primary Examiner* — Hien L Duong
(74) *Attorney, Agent, or Firm* — Tarolli, Sundheim, Covell & Tummino LLP

(57) ABSTRACT

One example includes a superconducting current control system. The system includes an inductive coupler comprising a load inductor and a control inductor. The inductive coupler can be configured to inductively provide a control current from the control inductor to a superconducting circuit device based on a load current being provided through the load inductor. The system also includes a current control element comprising a superconducting quantum interference device (SQUID) array comprising a plurality of SQUIDs. The current control element can be coupled to the inductive coupler to control an amplitude of the load current through the load inductor, and thus to control an amplitude of the control current to the superconducting circuit device.

19 Claims, 5 Drawing Sheets

(56)  References Cited

U.S. PATENT DOCUMENTS

| 5,963,351  | A    | 10/1999  | Kaplounenko et al. |
| 6,157,329  | A    | 12/2000  | Lee et al. |
| 6,184,477  | B1   | 2/2001   | Tanahashi |
| 6,242,939  | B1   | 6/2001   | Nagasawa et al. |
| 6,331,805  | B1   | 12/2001  | Gupta et al. |
| 6,653,962  | B2   | 11/2003  | Gupta et al. |
| 6,815,708  | B1   | 11/2004  | Iguchi et al. |
| 6,864,005  | B2   | 3/2005   | Mossman |
| 7,095,227  | B2   | 8/2006   | Tarutani et al. |
| 7,212,070  | B2   | 5/2007   | Westwick et al. |
| 7,227,480  | B2   | 6/2007   | Furuta et al. |
| 7,598,897  | B2   | 10/2009  | Kirichenko |
| 7,630,588  | B2   | 12/2009  | Ouchi |
| 7,689,070  | B2   | 3/2010   | Ouchi |
| 7,724,020  | B2   | 5/2010   | Herr |
| 7,724,083  | B2   | 5/2010   | Herr et al. |
| 7,772,871  | B2   | 8/2010   | Herr et al. |
| 7,782,077  | B2   | 8/2010   | Herr et al. |
| 7,786,748  | B1   | 8/2010   | Herr |
| 7,889,992  | B1   | 2/2011   | Divincenzo et al. |
| 7,969,178  | B2   | 6/2011   | Przybysz et al. |
| 7,977,964  | B2   | 7/2011   | Herr |
| 8,138,784  | B2   | 3/2012   | Przybysz et al. |
| 8,179,133  | B1   | 5/2012   | Kornev et al. |
| 8,188,901  | B1   | 5/2012   | Inamdar et al. |
| 8,610,453  | B2   | 12/2013  | Herr |
| 8,654,578  | B2   | 2/2014   | Lewis et al. |
| 8,670,807  | B2   | 3/2014   | Rose et al. |
| 8,849,075  | B2   | 9/2014   | Painter et al. |
| 8,952,671  | B2   | 2/2015   | Shimizu et al. |
| 9,097,751  | B1   | 8/2015   | Longhini et al. |
| 9,174,840  | B2   | 11/2015  | Herr et al. |
| 9,312,878  | B1   | 4/2016   | Inamdar et al. |
| 9,443,576  | B1   | 9/2016   | Miller |
| 9,455,707  | B2   | 9/2016   | Herr et al. |
| 9,467,126  | B1   | 10/2016  | Naaman et al. |
| 9,476,951  | B2 * | 10/2016  | Orozco ................. G01R 33/035 |
| 9,497,126  | B2   | 11/2016  | Matsuhira |
| 9,501,748  | B2   | 11/2016  | Naaman et al. |
| 9,529,035  | B2 * | 12/2016  | Orozco ................. G01R 31/088 |
| 9,588,191  | B1 * | 3/2017   | Kornev ................. H03K 3/013 |
| 9,595,970  | B1   | 3/2017   | Reohr et al. |
| 9,613,699  | B1   | 4/2017   | Reohr et al. |
| 9,646,682  | B1   | 5/2017   | Miller et al. |
| 9,735,776  | B1   | 8/2017   | Abdo et al. |
| 9,779,803  | B1   | 10/2017  | Konigsburg et al. |
| 9,780,765  | B2   | 10/2017  | Naaman et al. |
| 9,787,312  | B2   | 10/2017  | Herr et al. |
| 9,853,645  | B1   | 12/2017  | Mukhanov et al. |
| 9,876,505  | B1   | 1/2018   | Dai et al. |
| 9,887,700  | B2   | 2/2018   | Carmean et al. |
| 10,090,841 | B1   | 10/2018  | Herr |
| 10,122,350 | B2   | 11/2018  | Miller et al. |
| 10,122,351 | B1   | 11/2018  | Naaman et al. |
| 10,122,352 | B1 * | 11/2018  | Miller ..................... G11C 11/16 |
| 10,236,869 | B2   | 3/2019   | Herr et al. |
| 10,243,582 | B1   | 3/2019   | Herr |
| 10,320,394 | B1   | 6/2019   | Powell et al. |
| 10,355,677 | B1   | 7/2019   | Miller et al. |
| 10,389,336 | B1   | 8/2019   | Miller et al. |
| 10,447,278 | B1   | 10/2019  | Reohr et al. |
| 10,447,279 | B1   | 10/2019  | Braun |
| 10,491,178 | B2   | 11/2019  | Naaman et al. |
| 10,554,207 | B1   | 2/2020   | Herr et al. |
| 10,622,977 | B2   | 4/2020   | Naaman et al. |
| 10,892,761 | B1   | 1/2021   | Braun |
| 11,545,288 | B2   | 1/2023   | Strand |
| 2001/0025012 | A1 | 9/2001   | Tarutani et al. |
| 2003/0207766 | A1 | 11/2003  | Esteve et al. |
| 2004/0201099 | A1 | 10/2004  | Herr |
| 2004/0201400 | A1 | 10/2004  | Herr |
| 2004/0266209 | A1 | 12/2004  | Hinode et al. |
| 2005/0001209 | A1 | 1/2005   | Hilton et al. |
| 2005/0047245 | A1 | 3/2005   | Furuta et al. |
| 2005/0078022 | A1 | 4/2005   | Hirano et al. |
| 2005/0098773 | A1 | 5/2005   | Vion et al. |
| 2005/0117244 | A1 | 6/2005   | Ranmuthu |
| 2005/0231196 | A1 | 10/2005  | Tarutani et al. |
| 2006/0049891 | A1 | 3/2006   | Crete |
| 2006/0085160 | A1 | 4/2006   | Ouchi |
| 2006/0209413 | A1 | 9/2006   | Kim et al. |
| 2006/0255987 | A1 | 11/2006  | Nagasawa et al. |
| 2008/0049885 | A1 | 2/2008   | Inamdar |
| 2008/0267557 | A1 | 10/2008  | Wang et al. |
| 2008/0304038 | A1 | 12/2008  | Ouchi |
| 2009/0002014 | A1 | 1/2009   | Gupta et al. |
| 2009/0075825 | A1 | 3/2009   | Rose et al. |
| 2009/0082209 | A1 | 3/2009   | Bunyk et al. |
| 2010/0026537 | A1 | 2/2010   | Kirichenko |
| 2010/0033252 | A1 | 2/2010   | Herr et al. |
| 2012/0094838 | A1 | 4/2012   | Bunyk et al. |
| 2012/0274494 | A1 | 11/2012  | Kirichenko |
| 2013/0043945 | A1 | 2/2013   | Mcdermott et al. |
| 2013/0121633 | A1 | 5/2013   | Painter et al. |
| 2013/0278283 | A1 | 10/2013  | Berkley |
| 2015/0060650 | A1 | 3/2015   | Park |
| 2015/0060756 | A1 | 3/2015   | Park |
| 2015/0092465 | A1 | 4/2015   | Herr et al. |
| 2015/0094207 | A1 | 4/2015   | Herr et al. |
| 2015/0254571 | A1 | 9/2015   | Miller et al. |
| 2015/0349780 | A1 | 12/2015  | Naaman et al. |
| 2016/0013791 | A1 | 1/2016   | Herr et al. |
| 2016/0079968 | A1 | 3/2016   | Strand et al. |
| 2016/0087599 | A1 * | 3/2016 | Naaman ................... H01P 1/18 |
|            |      |          | 333/139 |
| 2016/0164505 | A1 | 6/2016   | Naaman et al. |
| 2017/0017742 | A1 | 1/2017   | Oberg et al. |
| 2017/0085231 | A1 | 3/2017   | Abdo |
| 2017/0141769 | A1 | 5/2017   | Miller et al. |
| 2018/0145664 | A1 | 5/2018   | Herr et al. |
| 2018/0226974 | A1 | 8/2018   | Harms et al. |
| 2018/0261932 | A1 | 9/2018   | Tuckerman |
| 2019/0131944 | A1 * | 5/2019 | Naaman ................. H03F 1/565 |
| 2019/0391214 | A1 * | 12/2019 | Ferguson .............. H10N 69/00 |
| 2020/0044632 | A1 | 2/2020   | Powell, III et al. |
| 2021/0327624 | A1 * | 10/2021 | Strand ................ G01R 33/0354 |
| 2022/0357371 | A1 | 11/2022  | Ballard et al. |

FOREIGN PATENT DOCUMENTS

| EP | 1213774 | B1 | 12/2010 |
| EP | 3217336 | A1 | 9/2017 |
| EP | 3378162 | A1 | 9/2018 |
| JP | S6192036 | A | 5/1986 |
| JP | 2000268579 | A | 9/2000 |
| JP | 2001251178 | A | 9/2001 |
| JP | 2001345488 | A | 12/2001 |
| JP | 2004080129 | A | 3/2004 |
| JP | 2005188947 | A | 7/2005 |
| JP | 2005527902 | A | 9/2005 |
| JP | 2006270282 | A | 10/2006 |
| JP | 2009225213 | A | 10/2009 |
| JP | 2010541309 | A | 12/2010 |
| JP | 2011530870 | A | 12/2011 |
| JP | 2013058998 | A | 3/2013 |
| JP | 2014529216 | A | 10/2014 |
| JP | 2015532806 | A | 11/2015 |
| JP | 5835377 | B2 | 12/2015 |
| JP | 6192036 | B2 | 9/2017 |
| WO | 98/08307 | A1 | 2/1998 |
| WO | 2005/093649 | A1 | 10/2005 |
| WO | 2008/050864 | A1 | 5/2008 |
| WO | 2009/023969 | A1 | 2/2009 |
| WO | 2009157532 | A1 | 12/2009 |
| WO | 2010/028183 | A2 | 3/2010 |
| WO | 2011/032825 | A1 | 3/2011 |
| WO | 2014/028302 | A2 | 2/2014 |
| WO | 2015050622 | A1 | 4/2015 |
| WO | 2016127021 | A1 | 8/2016 |
| WO | 2017087070 | A1 | 5/2017 |

(56) References Cited

FOREIGN PATENT DOCUMENTS

WO    2017/204977 A1    11/2017
WO    2018/044563 A1    3/2018

OTHER PUBLICATIONS

André, et al. : "A Coherent All-Electrical Interface Between Polar Molecules and Mesoscopic Superconducting Resonators"; Nature Physics, vol. 2, No. 9, Aug. 27, 2006, pp. 636-642; XP055174009, ISSN: 1745-2473; DOI: 10.1038/nphys386.

Aoki, et al.: "Observation of Strong Coupling Between One Atom and a Monolithic Microresonator", Norman Bridge Laboratory of Physics 12-33, California Institute of Technology, Pasadena, CA 91125, USA, Sep. 4, 2006, pp. 1-12.

Aspelmeyer, et al., "Cavity Optomechanics", Rev. Mod. Phys., vol. 86, No. 4, pp. 1391-1452 (2013), DOI: 10.113/RevModPhys.86. 1391.

Bochman, et al., "Nanomechanical Coupling between Microwave and Optical Photons", Nature Physics, vol. 9, No. 11, pp. 712-716 (2013), DOI: 10.1038/nphys2748.

Cicak et al: "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009 (Jun. 1, 2009), pp. 948-952, XP011262430, ISSN: 1051-8223.

CST AG Nanophotonics and integrated optics, "Photonic Crystal Cavities" (2013).

Dicarlo, et al.: "Demonstration of Two-Qubit Algorithms with a Superconducting Quantum Processor", Departments of Physics and Applied Physics, Yale University, New Haven, CT 06511, USA, May 1, 2009, pp. 1-6 & Supplemental Material pp. 1-3.

Eichenfield, et al.: "Optomechanical Crystals", California Institute of Technology, Pasadena, CA 91125, USA, Jun. 6, 2009, pp. 1-16.

Favero, et al., "Optomechanics of Deformable Optical Cavities", Nature Photonics, vol. 3, No. 4, pp. 201-205 (2009), DOI: 10.1038/nphoton.2009.42.

Google search results on "optical cavity nanophotonic crystal" Sep. 29, 2015.

Herr, et al.: "Ultra-Low-Power Superconductor Logic"; Journal of Applied Physics 109, 103903 (2011); Published Online: May 2011; https://doi.org/10.1063/1.3585849.

Herr: "A High-Efficiency Superconductor Distributed Amplifier"; Published Jan. 21, 2010 • IOP Publishing Ltd; Superconductor Science and Technology, vol. 23, No. 2.

Hossein-Zadeh, et al.: "An Optomechanical Oscillator on a Silicon Chip", IEEE Journal of Selected Topics in Quantum Electronics, vol. 16, No. 1, Jan./Feb. 2010, pp. 276-287.

Kimble: "The Quantum Internet", Norman Bridge Laboratory of Physics 12-33, Jun. 25, 2006, pp. 1-15.

Lin, et al.: "Coherent Mixing of Mechanical Excitations in Nano-Optomechanical Structures", Laboratory of Applied Physics, California Institute of Technology, Pasadena, CA 91125, USA, Aug. 7, 2009, pp. 1-27.

Mukhanov O A et al: "Development of Energy-efficient Cryogenic Optical (ECO) data link", 2013 IEEE 14th International Superconductive Electronics Conference (ISEC). IEEE, Jul. 7, 2013 (Jul. 7, 2013), pp. 1-3, XP032485120, DOI: 10.1109/ISEC.2013.6604276.

Mukhanov, et al.2: "Superconductor Analog-to-Digital Converters" Proceedings of the IEEE, IEEE. New York, US, vol. 92, No. 10, Oct. 1, 2004, pp. 1564-1584, XP011118881, ISSN: 0018-9219, DOI: 10.1109/JPROC.2004.833660, figure 8.

O'Connell, et al.: "Quantum Ground State and Single-Phonon Control of a Mechanical Resonator", Nature, Articles, vol. 464, Apr. 1, 2010, pp. 697-703.

Painter: Optomechanical crystals Photonics Conference (IPC), 2012 IEEE, IEEE, Sep. 23, 2012 (Sep. 23, 2012), p. 546, XP032269201, DOI: 10.1109/IPCON.2012.6358735 ISBN: 978-1-4577-0731-5.

Regal, et al.: "From Cavity Electromechanics to Cavity Optomechanics", 22nd International Conference on Atomic Physics, Journal of Physics: Conference Series 264 (2011) 012025, pp. 1-8.

Safavi-Naeini, et al.: "Proposal for an Optomechanical Traveling Wave Phonon-Photon Translator", New Journal of Physics 13 (2011) 013017 (30pp), Published Jan. 13, 2011, Online at http://www.njp.org, pp. 1-30.

Sillanpää, et al.: "Coherent Quantum State Storage and Transfer Between Two Phase Qubits via a Resonant Cavity", National Institute of Standards and Technology, 325 Broadway, Boulder, CO 80305, USA, Sep. 14, 2007, pp. 1-17.

Stannigel, et al., "Opto-Mechanical Transducers for Long-Distance Quantum Communication", Jun. 22, 2010, DOI: 10.1103/PhysRevLett. 105.220501.

Sun et al: "A superhigh-frequency optoelectromechanical system based on a slotted photonic crystal cavity", Applied Physics Letters, American Institute of Physics, US, vol. 101, No. 22. Nov. 26, 2012 (Nov. 26, 2012), pp. 221116-221116, XP012168118, ISSN: 0003-6951, DOI: 10.1063/1.4769045.

Tallur, et al., "Rayleigh Scattering Boosted Multi-GHz Displacement Sensitivity in Whispering Gallery Opto-Mechanical Resonators", Opt. Express 21, 27780-27788 (2013).

Tao, et al., "A Novel Transducer for Photon Energy Detection via Near-Field Cavity Optomechanics", in Solid-State Sensors, Actuators and Microsystems (Transducers & Eurosensors XXVII), 2013 Transducers & Eurosensors XXVII: The 17th International Conference on , vol. No., pp. 1511-1514, 16-20 (2013) DOI: 10.1109/Transducers.2013.6627068.

Teufel, et al. , "Prospects for Cooling Nanomechanical Motion by Coupling to a Superconducting Microwave Resonator", New Journal of Physicans, vol. 10, No. 9, pp. 095002 (2008), DOI: 10.1088/1367-2630/10/9/095002.

Teufel, et al.: "Circuit Cavity Electromechanics in the Strong-Coupling Regime", Letter, Nature, vol. 471, Mar. 10, 2011, pp. 204-208.

Winger et al.: "A chip-scale integrated cavity-electro-optomechanics platform", Optics Express, vol. 19, No. 25, Nov. 22, 2011 (Nov. 22, 2011), pp. 24905-24921, XP002732657.

Galiautdinov, et al.: " Resonator-zero-qubit architecture for superconducting qubits" Physical Review A 85.4 (201 2): 042321, Department of Electrical Engineering and Physics, University of California. pp. 1-11.

Allman, et al.: "rt-SQUID-Mediated Coherent Tunable Coupling Between a Superconducting Phase Qubit and a Lumped-Element Resonator"; Physical Review Letters, 2010 The American Physical Society, PRL 104, week endinq Apr. 2, 3001 O, paqes 177004-1 thru 177004-4.

Berns, et al., "Coherent Quasiclassical Dynamics of a Persistent Current Qubit", Physical Review Letters APS USA, vol. 97, No. 15, pp. 150502, Oct. 13, 2006.

Bourassa, et al.: "Ultra.strong coupling regime of cavity QED with phase-biased flux qubits" Physical Review A 80.3 (2009): 032109.

Choi, et al.: "80nm Self-Aligned Complementary I-MOS Using Double Sidewall Spacer and Elevated Drain Structure and Its Applicability to Amplifiers with High Linearity", IEEE Electron Device Letters, vol. 8, No. 5, dated 2004.

Choi, et al. 2: "Novel Tunneling Devices with Multi-Functionality", Japanese Journal of Applied Physics, vol. 16, No. 1B, dated 2007; pp. 2622-2625.

Garanin, et al., Effects of nonlinear sweep in the Landau-Zener-Stueckelberg effect, Physical Review B, vol. 66, No. 17, pp. 174438-1-174438-11, Nov. 1, 2002.

Gopalakrishnan, et al.: "Novel Very High IE Structures Based on the Directed BBHE Mechanism for Ultralow-Power Flash Memories", IEEE Electron Device Letters, vol. 26, No. 3, Mar. 2005.

Herr, et al: "Ultra-Low-Power Superconductor Logic", Journal of Applied Physics, American Institute of Physics, US, vol. 109, No. 10, May 17, 2011, pp. 103903-103903, XP012146891, ISSN: 0021-8979, 001: 10.1063/1.3585849, p. 2, left-hand column, paragraph 4—right-hand column, paragraph 1; Fig. 1.

(56) References Cited

OTHER PUBLICATIONS

Schuenemann, et al. "Interleaved Josephson junction tree decoder," IBM Technical Disclosure Bulletin, International Business Machines Corp. (Thorwood), US, vol. 18, No. 12, Apr. 30, 1976, pp. 4168, line 1—p. 4170, line 29; figures I, II.

Johnson, et al.: "A Scalable Control System for a Superconducting Adiabatic Quantum Optimization Processor"; arXiv:0907.3757v2 fquant-phl Mar. 24, 2010, paqes 1-14.

Koch, et al.: "A NRZ—Output Amplifier for RSFQ Circuits", IEEE Transaction on Applied Superconductivity, vol. 9, No. 2, pp. 3549-3552, Jun. 1999.

Long, et al., "A Simple Scheme to Generate X-type Four-charge Entangled States in Circuit Qed", Chinese Physics B, Chinese Physics B, Bristol GB, vol. 21, No. 4, Apr. 5, 2012 (Apr. 5, 2012), pp. 44209/1-5. XP020221550, ISSN: 1674-1056, DOI: 10.1088/1674-1056/21/4/044209.

Ohki, et al., "Low-Jc Rapid Single Flux Quantum (RSFQ) Qubit Control Circuit", IEEE Transactions on Applied Superconductivity, vol. 17, No. 2, Jun. 2007.

Ortlepp, et al.; "Experimental Analysis of a new Generation of compact Josephson-inductance-based RSFQ Circuits"; Authors are with the Institute of Information Technology, University of Technology Germany.

Polonsky, et al., Transmission of Single-Flux-Quantum Pulses along Superconducting Microstrip Lines, IEEE Trans. on Applied Superconductivity, vol. 3, No. 1, Mar. 1993, pp. 2598-2600.

RSFQubit , RSFQ Control of Josephson Junctions Qubits, D7: Report on the Evaluation of the RSFQ Circuitry for Qubit Control, Sep. 1, 2005, paqes 1-16.

Saira, et al.: "Entanglement genesis by anciila-based parity measurement in 20 circuit QED" Physical review letters 1 i 2.7 ( 201 4): 070502.

Semenov, et al., "SFQ Control Circuits for Josephson Junction Qubits", IEEE Trans. on Applied Superconductivity, vol. 13, No. 2, Jun. 2003, pp. 960-965.

Wulf, et al., Dressed States of Josephson Phase Qubit Coupled to an LC Circuit, IEEE Transaction on Applied Superconductivity IEEE USA, vol. 15, No. 2, pp. 856-859, Jun. 2, 2005.

* cited by examiner

SUPERCONDUCTING CURRENT CONTROL SYSTEM

GOVERNMENT INTEREST

The invention was made under Government Contract. Therefore, the US Government has rights to the invention as specified in that contract.

TECHNICAL FIELD

This disclosure relates generally to classical and superconducting computing systems, and more specifically to a superconducting current control system.

BACKGROUND

In a variety of different types of superconducting circuits, control loops are typically implemented to provide operational power to a given circuit via dynamic flux. The flux control can be delivered via a current flowing through a load inductor that is coupled to a current loop that includes a given superconducting circuit. The load inductor can be coupled to the current loop via an inductive coupling that implements a mutual inductance. To provide a sufficient amount of current to the superconducting circuit, a superconducting digital-to-analog converter (DAC) can be coupled to the load inductor to tune the current amplitude to the superconducting circuit. The DAC can thus be adjusted during a calibration process to provide the sufficient amplitude of the current to the superconducting circuit.

SUMMARY

One example includes a superconducting current control system. The system includes an inductive coupler comprising a load inductor and a control inductor. The inductive coupler can be configured to inductively provide a control current from the control inductor to a superconducting circuit device based on a load current being provided through the load inductor. The system also includes a current control element comprising a superconducting quantum interference device (SQUID) array comprising a plurality of SQUIDs. The current control element can be coupled to the inductive coupler to control an amplitude of the load current through the load inductor, and thus to control an amplitude of the control current to the superconducting circuit device.

Another example includes a method for controlling an amplitude of a control current provided to a superconducting circuit device. The method includes coupling the superconducting circuit device to a current control element via an inductive coupler. The current control element includes a SQUID array comprising a plurality of radio frequency (RF) SQUIDs. Each of the SQUIDs can be inductively coupled to a bias line. The method also includes providing an input current to the current control element and a load current associated with the inductive coupler to inductively provide the control current from a control inductor associated with the inductive coupler. The method further includes providing a bias current on the bias line to control an amplitude of the load current through the load inductor based on an amplitude of the bias current.

Another example includes a superconducting current control system. The system includes an inductive coupler comprising a load inductor and a control inductor. The inductive coupler can be configured to inductively provide a control current from the control inductor to a superconducting circuit device based on a load current being provided through the load inductor as a first portion of an input current that is received at an input of the superconducting current control system. A second portion of the input current can be provided parallel with the first portion. The system further includes a current control element comprising a first SQUID array and a second SQUID array arranged in parallel between a first terminal and a second terminal. Each of the first and second SQUID array includes a plurality of RF SQUIDs. Each of the RF SQUIDs can be inductively coupled to a bias line configured to conduct a bias current. The current control element can be coupled to the inductive coupler via at least one of the first and second terminals to control an amplitude of the load current through the load inductor based on an amplitude of the bias current. The control current can have an amplitude that is based on the amplitude of the load current.

DETAILED DESCRIPTION

Figure 1:
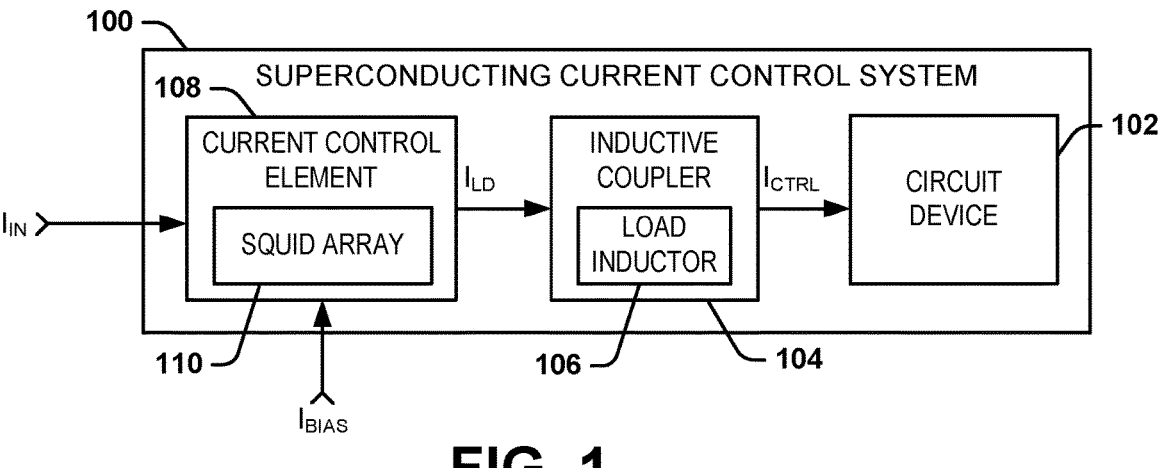
FIG. 1 illustrates an example of a superconducting current control system.

This disclosure relates generally to classical and superconducting computing systems, and more specifically to a superconducting current control system. The current control system can be implemented in any of a variety of classical and/or superconducting computer systems that may require providing a control current to a superconducting circuit device, such as to tune the control current to a sufficient optimal amplitude. For example, the superconducting current control system can be implemented to tune the amplitude of the control current to the sufficient optimal amplitude during calibration of the superconducting circuit device. The superconducting current control system can include an inductive coupler that includes a load inductor and a control inductor arranged with a mutual inductance with respect to each other. The load inductor can be configured to conduct a load current that is a portion of an input current provided to the superconducting current control system, thus inductively providing the control current via the control inductor to the superconducting circuit device. The control current therefore has an amplitude that is controlled based on an amplitude of the load current.

The superconducting current control system further includes a current control element that is coupled to the load inductor of the inductive coupler. The current control element can include an array of superconducting quantum interference devices (SQUIDs), such as radio frequency (RF) SQUIDs, arranged to conduct a portion of the input current to control the amplitude of the load current. Each of the SQUIDs can be separate inductively coupled to a bias line that is configured to provide a bias current. The bias current can have an amplitude that can control an amount of flux of each SQUID in the SQUID array to control an inductance of the current control element. The bias current can therefore be provided at a very small amplitude to provide sufficient tuning of the inductance of the inductive path provided by the current control element. As an example, based on the small amplitude of the bias current, the current source for the bias current (e.g., a digital-to-analog converter) can be included on the same integrated circuit (IC) as the current control element, such as provided in a superconducting cold space.

The input current can be provided as an input to the superconducting current control system. Therefore, the load inductor can be configured to conduct a first portion of the input current to inductively provide the control current. A second portion of the input current can be provided in parallel with the first portion of the input current. For example, the current control element can be arranged in parallel with the load inductor to conduct the second portion of the input current, such that the load inductor conducts the first portion of the input current. As another example, the current control element can be arranged in series with the load inductor, with a current path being arranged in parallel with the series connection of the load inductor and the current control element. Thus, the current control element and the load inductor can conduct the first portion of the input current and the current path can conduct the second portion of the input current. The current path can be provided as a shunt inductor or a second current control element that is separately (e.g., inversely proportionally) tuned relative to the first current control element. Therefore, based on the tuning of the amplitude of the current through the inductive current path of the current control element, the amplitude of the current through the load inductor, and therefore the control current, can be adjusted to a desired amplitude.

FIG. 1 illustrates an example of a superconducting current control system 100. The superconducting current control system 100 can be implemented in any of a variety of classical and superconducting computer systems that may require providing a control current $I_{CTRL}$ to a superconducting circuit device 102, such as during calibration of the superconducting circuit device 102.

In the example of FIG. 1, the superconducting current control system 100 receives an input current $I_{IN}$ that can have a static current amplitude. The superconducting current control system 100 includes an inductive coupler 104 that can include a load inductor 106 and a control inductor arranged with a mutual inductance with respect to each other. The load inductor 106 can be configured to conduct a load current $I_{LD}$ that is a first portion of the input current $I_{IN}$ provided to the superconducting current control system 100. As a result, the inductive coupler 104 can provide the control current $I_{CTRL}$ via the associated control inductor to the superconducting circuit device 102. The control current $I_{CTRL}$ therefore has an amplitude that is controlled based on an amplitude of the load current $I_{LD}$. As an example, a second portion of the input current $I_{IN}$ can be provided in parallel with the first portion of the input current $I_{IN}$, as described in greater detail herein, such that the first and second portions of the input current $I_{IN}$ have a sum that is equal to the total amplitude of the input current $I_{IN}$.

The superconducting current control system 100 further includes a current control element 108. The current control element 108 can include an array of superconducting quantum interference devices (SQUIDs) 110, such as radio frequency (RF) SQUIDs, arranged to conduct a portion of the input current $I_{IN}$ to control the amplitude of the load current $I_{LD}$. For example, the current control element 108 can be coupled to the load inductor 106, such that an inductance of the current control element 108 can be controlled to divert the first portion of the input current $I_{IN}$ through the load inductor 106. In the example of FIG. 1, the current control element 108 receives a bias current $I_{BIAS}$ that has an amplitude that can control an amount of flux of each of the SQUIDs in the SQUID array 110 of the current control element 108, such as to control the inductance of the current control element 108.

As an example, the SQUID array 110 can include a plurality of RF SQUIDs that are arranged in an alternating arrangement along an array. Each of the RF SQUIDs can include a Josephson junction and a pair of inductors that form an inductive path of a portion of the input current $I_{IN}$ that is controlled by the bias current $I_{BIAS}$ to control an amplitude of the load current $I_{LD}$. For example, the arrangement of the RF SQUIDs in the SQUID array 110 can include two inductive paths in parallel, such that the SQUID array 110 can include two RF SQUID arrays provided in parallel between respective terminals of the current control element 108.

As an example, each of the SQUIDs in the SQUID array 110 can be inductively coupled to a bias line that provides the bias current $I_{BIAS}$. Therefore, the bias current $I_{BIAS}$ can be inductively provided to each individual SQUID of the SQUID array 110. The bias current $I_{BIAS}$ can therefore be provided at a very small amplitude to provide sufficient tuning of the inductance of the inductive path provided by the current control element 108. As an example, based on the small amplitude of the bias current $I_{BIAS}$, the current source for the bias current (e.g., a digital-to-analog converter) can be included on the same integrated circuit (IC) as the current control element 108, such as provided in a superconducting cold space.

As described in greater detail herein, the current control element 108 can be arranged in parallel with or in series with the load inductor 106. Therefore, the load inductor 106 can conduct a portion of the input current $I_{IN}$ having an amplitude that can be adjusted to control the amplitude of the control current provided to the superconducting circuit device 102.

Figure 2:
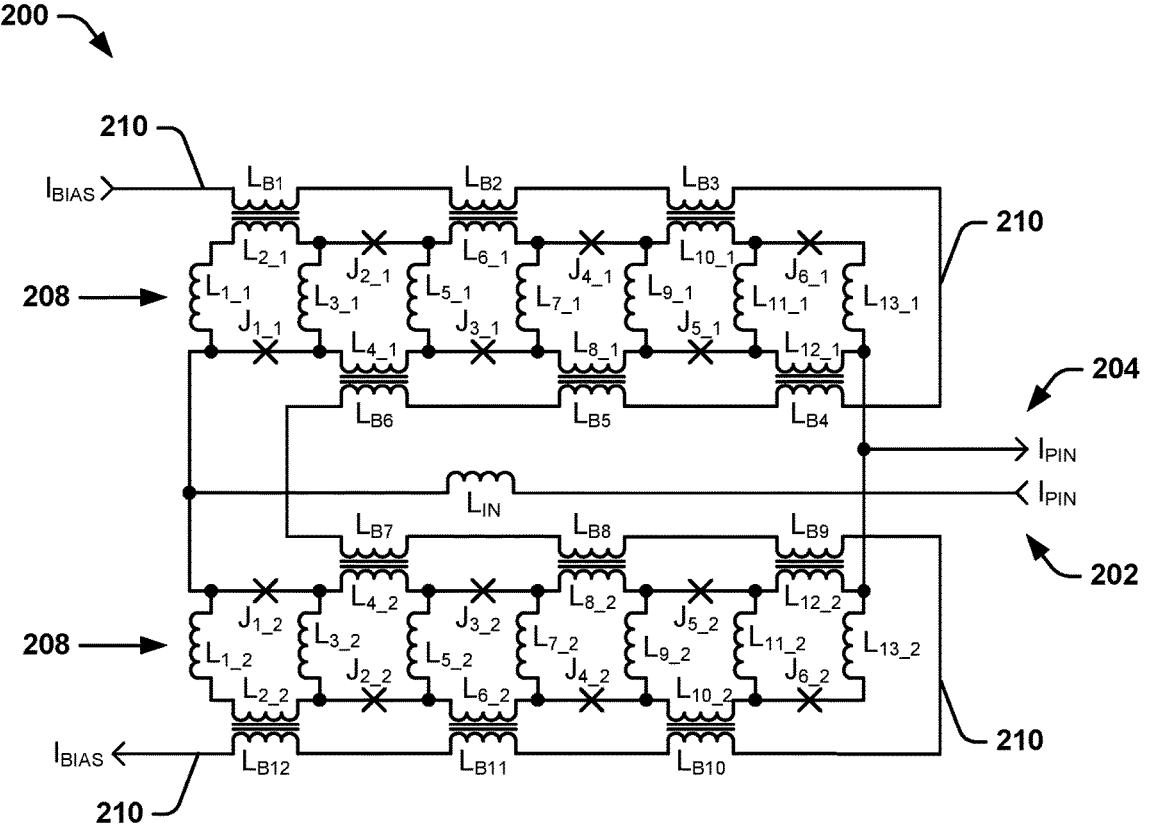
FIG. 2 illustrates an example of a current control element.

FIG. 2 illustrates an example of a current control element 200. The current control element 200 can correspond to the current control element 108 in the example of FIG. 1. Therefore, reference is to be made to the example of FIG. 1 in the following description of the example of FIG. 2.

The current control element 200 includes a first terminal 202 and a second terminal 204. As an example, at least one of the first and second terminals 202 and 204 can be coupled to the inductive coupler 104 in the example of FIG. 1. The first terminal 202 is coupled to an input inductor $L_{IN}$ in a manner that the input inductor $L_{IN}$ is split between each of two SQUID arrays of the current control element 200, as described in greater detail herein. The second terminal 204 is arranged opposite the first terminal 202 with respect to a current path for a portion of the input current, demonstrated as $I_{PIN}$ through the two SQUID arrays. The SQUID arrays are each configured as a plurality of RF SQUIDs 208, with the arrangement of RF SQUIDs 208 being arranged in two parallel alternating array sequences of RF SQUIDs 208 between the first and second terminals 202 and 204. In the example of FIG. 2, each of the SQUID arrays includes a sequence of six RF SQUIDs 208 demonstrated as mirror-images with respect to each other between the first and second terminals 202 and 204. As an example, the quantity of RF SQUIDs can be greater than or less than six to balance increased inductance of the current path through the current control element 200 relative to spatial considerations.

Each of the RF SQUIDs 208 includes a pair of inductors and a Josephson junction. In each of the two N-sequence arrays of RF SQUIDs 208, the inductors are labeled $L_{X\_Y}$, with X corresponding to an index of the respective inductor along the respective array of the RF SQUIDs 208 and with Y corresponding to which of the two arrays of RF SQUIDs 208 in which it is included (e.g., "_1" or "_2"). Similarly, in each of the two N-sequence arrays of RF SQUIDs 208, the Josephson junctions are labeled $J_{Z\_Y}$, with Z corresponding to an index of the respective Josephson junction along the respective array of the RF SQUIDs 208. As an example, all of the Josephson junctions $J_Z$ can have an approximately equal critical current $I_C$. In the example of FIG. 2, the first inductor of each of the RF SQUIDs 208, with the exception of the first inductor $L_1$, is common to a preceding RF SQUID 208 in the sequence of RF SQUIDs 208. The last RF SQUID 208 of each of the arrays includes an additional inductor $L_{13}$ that is coupled to the second terminal 204. As described herein, in the example of FIG. 2, the inductors $L_X$ of the RF SQUIDs 208 of each of the arrays of SQUIDs form an inductive path for half the portion $I_{PIN}$ of the input current (e.g., $I_{PIN}/2$) between the first and second terminals 202 and 204, with each of the inductive paths being provided through the inductors $L_{X\_1}$ and $L_{X\_2}$ in parallel with each of the respective Josephson junctions $J_{Z\_1}$ and $J_{Z\_2}$. As described in greater detail herein, the flux of each of the RF SQUIDs 208 can be controlled via a direct current (DC) bias current $I_{BIAS}$ to provide a controlled variable inductance between the first and second terminals 202 and 204.

Each of the inductors ($L_2$, $L_4$, $L_6$, $L_8$, $L_{10}$, and $L_{12}$) opposite the Josephson junction in each of the RF SQUIDs 208 is inductively coupled to a bias line 210 that is config-ured to provide the bias current $I_{BIAS}$. In the example of FIG. 2, the inductor $L_{2\_1}$ forms a transformer with an inductor $L_{B1}$, the inductor $L_{6\_1}$ forms a transformer with an inductor $L_{B2}$, and the inductor $L_{10\_1}$ forms a transformer with an inductor $L_{B3}$. As demonstrated in the example of FIG. 2, the bias line 210 wraps around the arrays of RF SQUIDs 208 with respect to itself. Therefore, the inductor $L_{12\_1}$ forms a transformer with an inductor $L_{B4}$, the inductor $L_{8\_1}$ forms a transformer with an inductor $L_{B5}$, and the inductor $L_{4\_1}$ forms a transformer with an inductor $L_{B6}$. Similarly, the inductor $L_{4\_2}$ forms a transformer with an inductor $L_{B7}$, the inductor $L_{8\_2}$ forms a transformer with an inductor $L_{B8}$, and the inductor $L_{12\_2}$ forms a transformer with an inductor $L_{B9}$, the inductor $L_{10\_2}$ forms a transformer with an inductor $L_{B10}$, the inductor $L_{6\_2}$ forms a transformer with an inductor $L_{B11}$, and the inductor $L_{2\_2}$ forms a transformer with an inductor $L_{B12}$. Therefore, in the current control element 200, each of the RF SQUIDs 208 is individually biased an equal amount by the bias current $I_{BIAS}$, thereby providing an approximately equal flux in each of the RF SQUIDs 208.

As described previously, the current control element 200 is demonstrated as being formed as two arrays of RF SQUIDs, with each of the six stages of each of the arrays being composed of a Josephson junction $J_Z$ having a critical current $I_C$ shunted by the respective linear inductors $L_X$. Therefore, the inductance of the two arrays in parallel, and the flux derivative $L'_T(\Phi_{ac})$, can be expressed as:

$$L_T(\delta_0(\Phi_{dc})) = \frac{N}{2} \frac{(L_1 + L_2)L_J + L_1 L_2 \cos\delta_0}{L_J + (4L_1 + L_2)\cos\delta_0} \qquad \text{Equation 1}$$

$$L_{T'}(\delta_0(\Phi_{dc})) = \qquad\qquad\qquad\qquad \text{Equation 2}$$

$$\frac{(2L_1 + L_2)^3 L_J^2 \pi \sin\delta_0}{2\Phi_0[(L_1 + L_2)L_J + L_1 L_2 \cos\delta_0][L_J + (4L_1 + L_2)\cos\delta_0]^2}$$

$$L_J = \hbar/2eI_c \qquad\qquad\qquad\qquad \text{Equation 3}$$

Where: $\Phi_0$ is a flux quantum, and $\delta_0(\Phi_{dc})$ can be expressed as:

$$\left(\frac{1}{L_1} + \frac{1}{L_2}\right)\delta_0 + \frac{1}{L_J}\sin\delta_0 = \frac{\pi\Phi_{dc}}{N\Phi_0}\left(\frac{1}{L_1} + \frac{2}{L_2}\right) \qquad \text{Equation 4}$$

Therefore, Equations 1-4 demonstrate how the inductance of the current control element 200 can be controlled by the bias current $I_{BIAS}$ to provide an inductive current path for a portion of the input current $I_{IN}$.

As a result of the arrangement of the current control element 200, the current control element 200 can be imple-mented to set the current amplitude of the load current $I_{LD}$ through the load inductor 106 to set the amplitude of the control current $I_{CTRL}$ that is inductively provided to the superconducting circuit device 102 via the inductive coupler 104. The arrangement of the array of RF SQUIDs 208 in the current control element 200 can be such that the Josephson junctions $J_Z$ are prohibited from triggering to provide a hysteretic effect. In providing an inductive current path for the portion $I_{PIN}$ of the input current, hysteretic behavior of the RF SQUIDs resulting from triggering of the Josephson junctions $J_Z$ would provide for undesirable behavior as the triggering of the Josephson junctions $J_Z$ would interfere with the amplitude of the portion $I_{PIN}$ of the input current. Therefore, each of the RF SQUIDs 208 can be designed such that the ratio $\beta_L$, corresponding to a ratio of the geometric inductance of the inductors $L_X$ over the Josephson induc-tance of the Josephson junctions $J_Z$ can be less than one.

As a result, as described herein, the current control element 200 can operate to control the amplitude of the load current $I_{LD}$, and thus the control current $I_{CTRL}$, without exhibiting hysteretic behavior, as opposed to typical current control methods that implement a simple SQUID to provide an inductive current path for the input current $I_{IN}$. Accord-ingly, the current control element 200 can operate with a significantly higher dynamic range relative to typical current control methods that implement a single SQUID. Further-more, as described above, because the bias current $I_{BIAS}$ is inductively provided individually to each of the RF SQUIDs 208, the bias current $I_{BIAS}$ can be provided at a very small amplitude to provide sufficient tuning of the inductance of the inductive path provided by the current control element 108, as opposed to a single inductive coupling of a bias current to both of the SQUID arrays, as is provided in other conventional current control systems.

Figure 3:
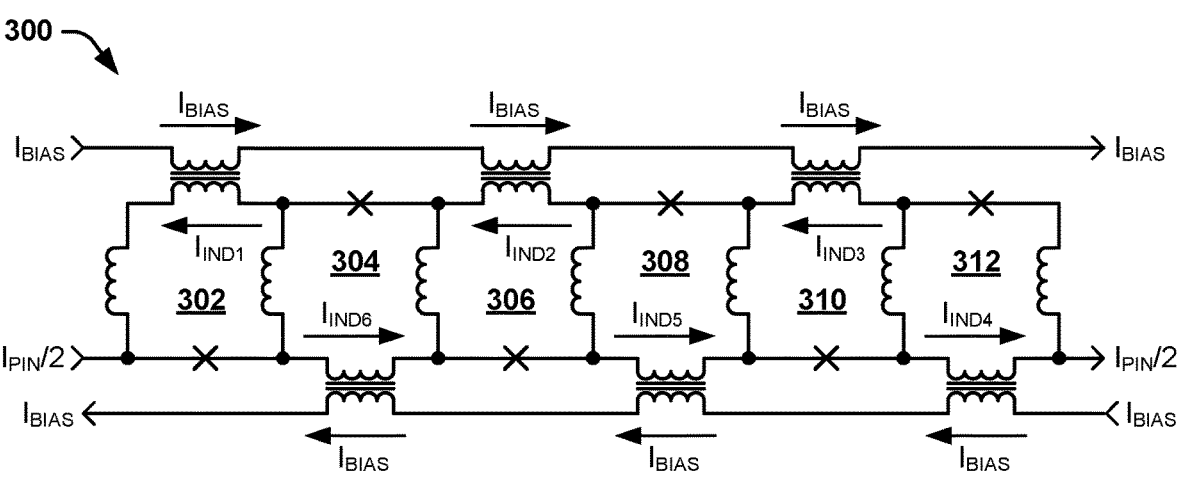
FIG. 3 illustrates an example of a SQUID array.

FIG. 3 illustrates an example of a SQUID array 300. The SQUID array 300 can correspond to one of the SQUID arrays of RF SQUIDs 208 in the example of FIG. 2. Therefore, reference is to be made to the example of FIG. 2 in the following description of the example of FIG. 3. Furthermore, the operation of the SQUID array 300 is identical (e.g., mirror-imaged) with respect to the other of the SQUID arrays of the RF SQUIDs 208 in the example of FIG. 2.

The SQUID array 300 is demonstrated as including the six RF SQUIDs demonstrated as a first SQUID 302, a second SQUID 304, a third SQUID 306, a fourth SQUID 308, a fifth SQUID 310, and a sixth SQUID 312. The SQUIDs 302, 304, 306, 308, 310, and 312 each correspond to one of the SQUIDs 208 in the example of FIG. 2, with the descriptors for the inductors and Josephson junctions removed for simplicity. Because the SQUID array 300 corresponds to one of the mirror-image SQUID arrays in the example of FIG. 2, half of the portion of the input current $I_{PIN}/2$ is demonstrated as being provided through the SQUID array 300.

In the example of FIG. 3, a portion of the bias line 210 is likewise demonstrated in the example of FIG. 3, including the inductors $L_{B1}$ through $L_{B6}$ that are inductively coupled to the respective RF SQUIDS 208 of the SQUID array 300, as described above in the example of FIG. 2. Therefore, in response to the bias current $I_{BIAS}$ provided through the inductors $L_{B1}$ through $L_{B6}$, the respective inductors in the RF SQUIDs 208 (e.g., the inductors $L_{2\_1}$, $L_{4\_1}$, $L_{6\_1}$, $L_{8\_1}$, $L_{10\_1}$, and $L_{12\_1}$) induce respective currents in the respective RF SQUIDs 208. In the example of FIG. 3, the induced currents are demonstrated as $I_{IND1}$ for the first SQUID 302, $I_{IND2}$ for the second SQUID 304, $I_{IND3}$ for the third SQUID 306, $I_{IND4}$ for the fourth SQUID 308, $I_{IND5}$ for the fifth SQUID 310, and $I_{IND6}$ for the sixth SQUID 312.

Based on the direction of the current $I_{BIAS}$ relative to the topology of the SQUIDs 302, 304, 306, 308, 310, and 312, the induced currents $I_{IND1}$, $I_{IND2}$, $I_{IND3}$, $I_{IND4}$, $I_{IND5}$, and $I_{IND6}$ are each provided in a counter clock-wise direction in the respective SQUIDs 302, 304, 306, 308, 310, and 312. Because the currents in each of the SQUIDs 302, 304, 306, 308, 310, and 312 are provided equally in opposite directions into or from the shared inductors between adjoining SQUIDs, the induced currents $I_{IND1}$, $I_{IND2}$, $I_{IND3}$, $I_{IND4}$, $I_{IND5}$, and $I_{IND6}$ can be localized to the respective SQUIDs 302, 304, 306, 308, 310, and 312. Accordingly, the induced currents $I_{IND1}$, $I_{IND2}$, $I_{IND3}$, $I_{IND4}$, $I_{IND5}$, and $I_{IND6}$ can be provided in a manner that does not interfere with the portion of the input current $I_{PIN}/2$ through the SQUID array 300.

Figure 4:
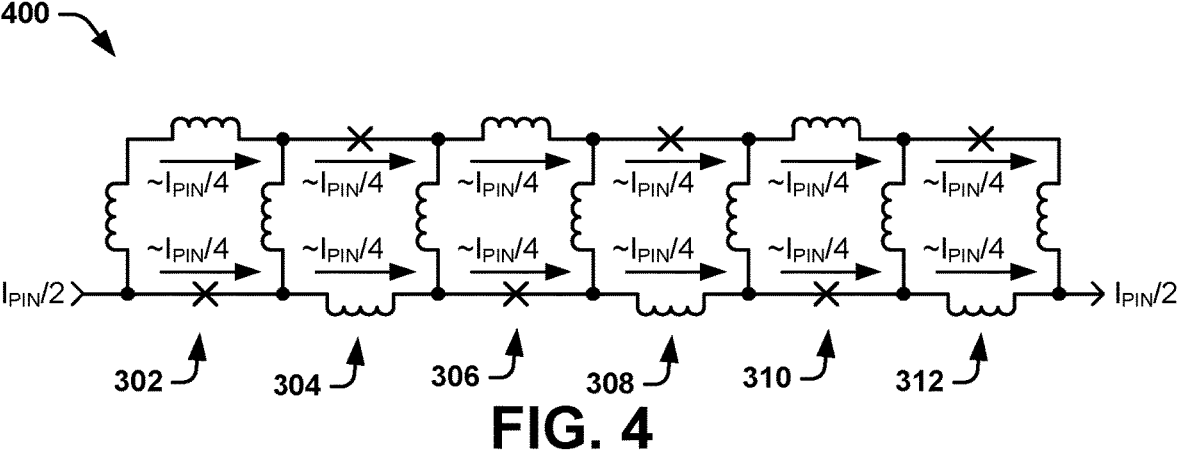
FIG. 4 illustrates another example of a SQUID array.

FIG. 4 illustrates an example of a SQUID array 400. The SQUID array 400 can correspond to the SQUID array 300 in the example of FIG. 3. Therefore, reference is to be made to the example of FIGS. 2 and 3 in the following description of the example of FIG. 4.

The SQUID array 400 is demonstrated as including the six RF SQUIDs 302, 304, 306, 308, 310, and 312. Additionally, the SQUID array 400 is demonstrated in the example of FIG. 4 as not including the bias line 310 for brevity. The SQUID array 400 is demonstrated by example as providing an inductive current path for the portion of the input current $I_{PIN}/2$. In the example of FIG. 4, the amplitude of the bias current $I_{BIAS}$ can be approximately zero, such as to provide a minimum (e.g., zero) flux in each of the respective SQUIDs 302, 304, 306, 308, 310, and 312.

Therefore, the portion $I_{PIN}/2$ can have a maximum amplitude based on being provided with a low-inductance current path through the SQUID array 400. Particularly, in the example of FIG. 4, the portion $I_{PIN}/2$ of the input current can be approximately equally divided between the Josephson junctions $J_Z$ and the inductors opposite the Josephson junctions $J_Z$ (e.g., the inductors $L_{2\_1}$, $L_{4\_1}$, $L_{6\_1}$, $L_{8\_1}$, $L_{10\_1}$, and $L_{12\_1}$) as currents $I_{PIN}/4$ from one end of the SQUID array 400 to the opposite end of the SQUID array 400. Thus, very little (e.g., approximately zero) current flows through the inductors interconnecting the Josephson junctions $J_Z$ and the inductors opposite the Josephson junctions $J_Z$. Accordingly, by providing a maximum of the first portion of the input current $I_{IN}$ through the current control element 200, the load current $I_{LD}$ is provided accordingly through the load inductor 106 at either a minimum amplitude or a maximum amplitude. As a result, the control current $I_{CTRL}$ can be provided at a likewise minimum or maximum, depending on the topology of the superconducting current control system 100, as explained in greater detail herein.

Figure 5:
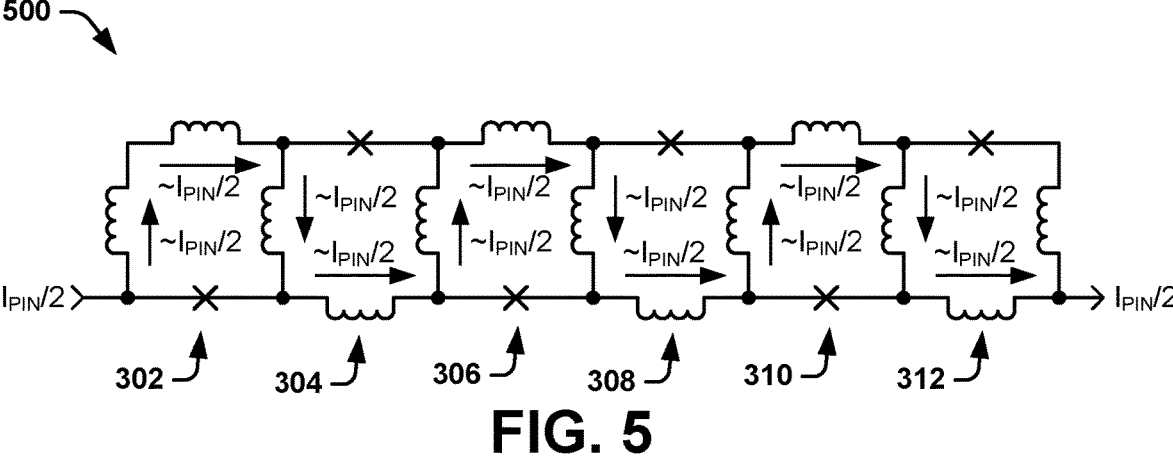
FIG. 5 illustrates another example of a SQUID array.

FIG. 5 illustrates an example of a SQUID array 500. The SQUID array 500 can correspond to the SQUID array 300 in the example of FIG. 3. Therefore, reference is to be made to the example of FIGS. 2 and 3 in the following description of the example of FIG. 5.

The SQUID array 500 is demonstrated as including the six RF SQUIDs 302, 304, 306, 308, 310, and 312. Additionally, the SQUID array 500 is demonstrated in the example of FIG. 5 as not including the bias line 310 for brevity. The SQUID array 500 is demonstrated by example as providing an inductive current path for the portion of the input current $I_{PIN}/2$. In the example of FIG. 5, the amplitude of the bias current $I_{BIAS}$ can be sufficient to provide a flux in each of the RF SQUIDs 302, 304, 306, 308, 310, and 312 of approximately $\Phi_0/2$, thereby corresponding to a maximum inductance of each of the Josephson junctions $J_1$, $J_2$, $J_3$, $J_4$, $J_5$, and $J_6$ in the respective SQUIDs 302, 304, 306, 308, 310, and 312.

Therefore, the portion $I_{PIN}/2$ can have a minimum amplitude based on being provided with a high-inductance current path through the SQUID array 500. Particularly, in the example of FIG. 5, the maximum flux of $\Phi_0/2$ provides for a maximum inductance of the Josephson junctions $J_Z$. As a result, approximately the entirety of the portion $I_{PIN}/2$ of the input current can be provided through each of the inductors $L_X$ (e.g., the inductors $L_{1\_1}$ through $L_{13\_1}$), and thus steered away from flowing through the high-inductance Josephson junctions $J_Z$, from one end of the SQUID array 500 to the opposite end of the SQUID array 500. Accordingly, by providing a maximum of the first portion of the input current $I_{IN}$ through the current control element 200, the load current $I_{LD}$ is provided accordingly through the load inductor 106 at either a minimum amplitude or a maximum amplitude. As a result, the control current $I_{CTRL}$ can be provided at a likewise minimum or maximum, depending on the topology of the superconducting current control system 100, as explained in greater detail herein.

Figure 6:
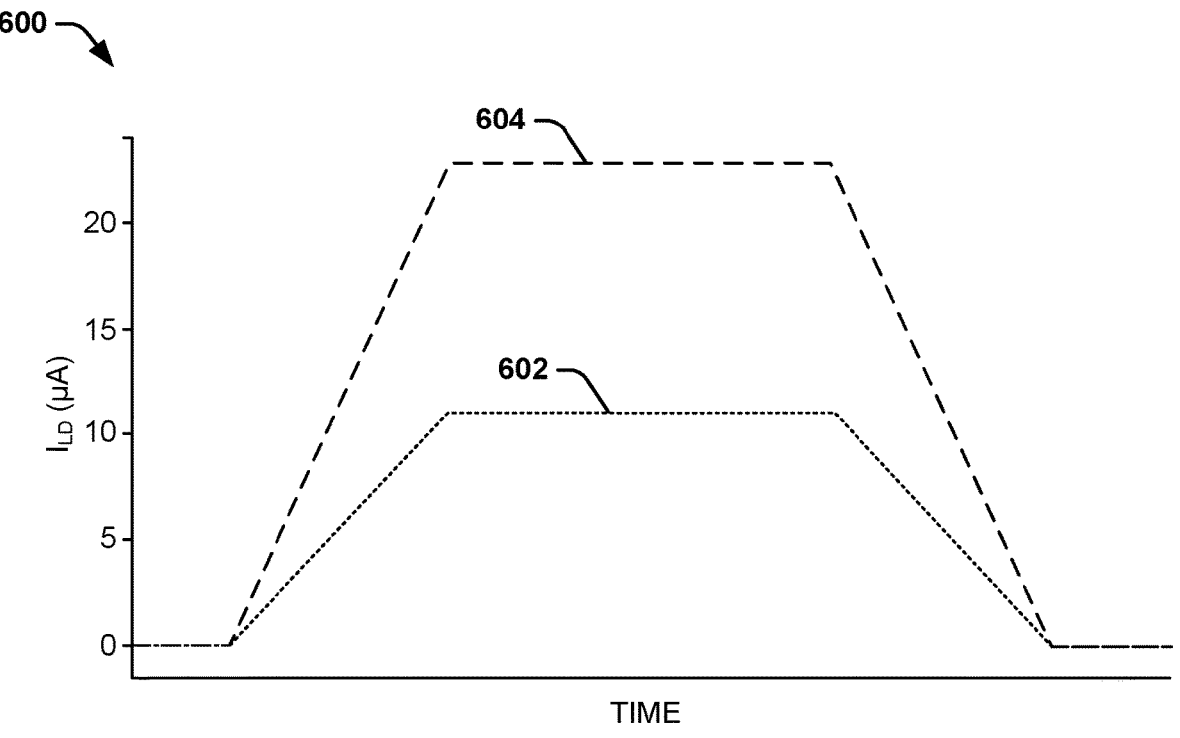
FIG. 6 illustrates an example of a timing diagram.

An example of the relative amplitudes of the of the first portion of the input current $I_{IN}$ through the current control element 200 is demonstrated in the example of FIG. 6. FIG. 6 illustrates an example of a timing diagram 600. The timing diagram 600 plots an amplitude of the load current $I_{LD}$ (in $\mu A$) as a function of time based on the minimum flux and maximum flux in each of the RF SQUIDs 302, 304, 306, 308, 310, and 312 (and therefore the RF SQUIDs in the other mirror-imaged SQUID array of the current control element 200).

The timing diagram 600 includes a first line 602, demonstrated as a dotted line, that corresponds to a minimum amplitude of the load current $I_{LD}$, and therefore a minimum amplitude of the control current $I_{CTRL}$. In the example of FIG. 6, the first line 602 is demonstrated as having a maximum amplitude of approximately 10.9 $\mu A$ for the load current $I_{LD}$. As an example, the current control element 200 can be arranged parallel with the load inductor 106, such as to divert a second portion of the input current $I_{IN}$ to provide the first portion of the input current $I_{IN}$ as the load current $I_{LD}$ corresponding to the first line 602 through the load inductor $L_{LD}$. Therefore, the first line 602 can correspond to a minimum amplitude of the load current $I_{LD}$ that can result from providing zero flux in the SQUIDs 302, 304, 306, 308, 310, and 312 (and the mirror-image SQUIDs) based on a bias current $I_{BIAS}$ of approximately zero amps, as demonstrated in the example of FIG. 4.

The timing diagram 600 also includes a second line 604, demonstrated as a dashed line, that corresponds to a maximum amplitude of the load current $I_{LD}$, and therefore a maximum amplitude of the control current $I_{CTRL}$. In the example of FIG. 6, the second line 604 is demonstrated as having a maximum amplitude of approximately 22.7 μA for the load current $I_{LD}$. As described above, the current control element 200 can be arranged parallel with the load inductor 106 to divert a second portion of the input current $I_{IN}$ to provide the first portion of the input current $I_{IN}$ as the load current $I_{LD}$. Therefore, the second line 604 can correspond to a maximum amplitude of the load current $I_{LD}$ that can result from providing $\Phi_0/2$ flux in the SQUIDs 302, 304, 306, 308, 310, and 312 (and the mirror-image SQUIDs) based on providing sufficient bias current $I_{BIAS}$, as demonstrated in the example of FIG. 5.

Figure 7:
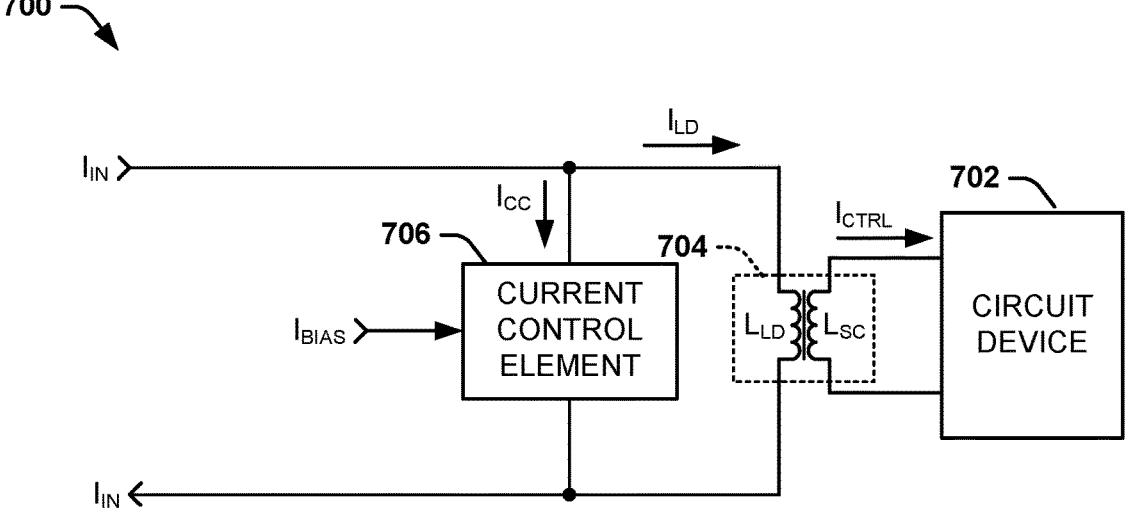
FIG. 7 illustrates another example of a superconducting current control system.

FIG. 7 illustrates an example of a superconducting current control system 700. The superconducting current control system 700 can be implemented in any of a variety of classical and superconducting computer systems that may require providing a control current $I_{CTRL}$ to a superconducting circuit device 702, such as during calibration of the superconducting circuit device 702.

In the example of FIG. 7, the superconducting current control system 700 receives an input current $I_{IN}$ that can have a static current amplitude. As an example, the input current $I_{IN}$ can be provided from a DAC. The superconducting current control system 700 includes an inductive coupler 704, demonstrated in the example of FIG. 7 as a transformer includes a load inductor $L_{LD}$ and a control inductor $L_{SC}$ arranged with a mutual inductance with respect to each other. The superconducting current control system 700 also includes a current control element 706 that is demonstrated in the example of FIG. 7 as being arranged in parallel with the load inductor $L_{LD}$. Therefore, the current control element 706 is configured to conduct a second portion of the input current $I_{IN}$, demonstrated as a current $I_{CC}$, and the load inductor $L_{LD}$ is configured to conduct a load current $I_{LD}$ that is a first portion of the input current $I_{IN}$ (e.g., such that the sum of the current $I_{CC}$ and the load current $I_{LD}$ is approximately equal to the input current $I_{IN}$). As a result, the control inductor $L_{SC}$ can provide the control current $I_{CTRL}$ to the superconducting circuit device 702 based on an amplitude of the load current $I_{LD}$.

As an example, the current control element 706 can correspond to the current control element 200 in the example of FIG. 2. Therefore, the current control element 706 can be arranged such that the opposite ends of the load inductor $L_{LD}$ can be coupled to the respective terminals 202 and 204 to provide the parallel arrangement between the current control element 706 and the load inductor $L_{LD}$. Similar to as described previously, the current control element 706 includes an array of RF SQUIDs arranged to conduct the current $I_{CC}$ to control the amplitude of the load current $I_{LD}$. In the example of FIG. 7, the current control element 706 receives the bias current $I_{BIAS}$ that has an amplitude that can control an amount of flux of the RF SQUID array of the current control element 706, such as to control the inductance of the current control element 706.

Therefore, the load inductor $L_{LD}$ can conduct the load current $I_{LD}$ having an amplitude that can correspond to the amplitude of the control current $I_{CTRL}$ provided to the superconducting circuit device 702. For example, when the current control element 706 is unbiased (e.g., the bias current $I_{BIAS}$ having an approximately zero amplitude), the current control element 706 can divert approximately half the input current $I_{IN}$ from the load inductor $L_{LD}$ to provide a minimum current amplitude to the load inductor $L_{LD}$ (e.g., the first line 602 of the example of FIG. 6), and can divert a minimum (e.g. approximately one-third) of the input current $I_{IN}$ from the load inductor $L_{LD}$ when approximately maximally biased to provide a maximum current amplitude to the load inductor $L_{LD}$ (e.g., the second line 604 of the example of FIG. 6). Therefore, the current control element 706 can provide a dynamic range of approximately twice the load current $I_{LD}$ between the approximate zero and the approximate full bias conditions.

While the example of FIG. 7 demonstrates that the current control element 200 can be arranged in parallel with the load inductor $L_{LD}$, other arrangements are possible. For example, the current control element 200 can be arranged in series with the load inductor $L_{LD}$ to control the amplitude of the first portion of the input current $I_{IN}$, and the second portion of the input current $I_{IN}$ can be provided through a current path in parallel with the series connection of the current control element 200 and the load inductor $L_{LD}$, as demonstrated in the examples of FIGS. 8 and 9.

Figure 8:
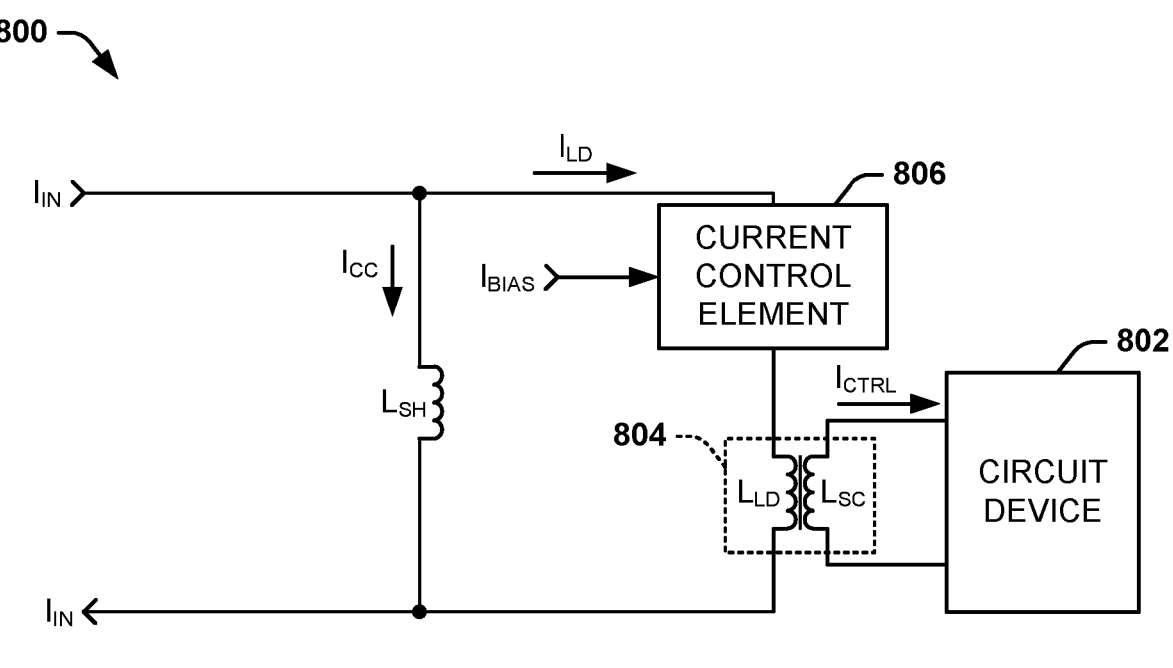
FIG. 8 illustrates yet another example of a superconducting current control system.

FIG. 8 illustrates an example of a superconducting current control system 800. The superconducting current control system 800 can be implemented in any of a variety of classical and superconducting computer systems that may require providing a control current $I_{CTRL}$ to a superconducting circuit device 802, such as during calibration of the superconducting circuit device 802.

In the example of FIG. 8, the superconducting current control system 800 receives an input current $I_{IN}$ that can have a static current amplitude. The superconducting current control system 800 includes an inductive coupler 804, demonstrated in the example of FIG. 8 as a transformer includes a load inductor $L_{LD}$ and a control inductor $L_{SC}$ arranged with a mutual inductance with respect to each other. The superconducting current control system 800 also includes a current control element 806 that is demonstrated in the example of FIG. 8 as being arranged in series with the load inductor $L_{LD}$. The superconducting current control system 800 further includes a shunt inductor $L_{SH}$ that is arranged in parallel with the series arrangement of the current control element 806 and the load inductor $L_{LD}$. Therefore, the shunt inductor $L_{SH}$ is configured to conduct a current $I_{CC}$ that corresponds to a second portion of the input current $I_{IN}$, and the series arrangement of the current control element 806 and the load inductor $L_{LD}$ is configured to conduct a load current $I_{LD}$ that is a first portion of the input current $I_{IN}$ (e.g., such that the sum of the current $I_{CC}$ and the load current $I_{LD}$ is approximately equal to the input current $I_{IN}$). As a result, the control inductor $L_{SC}$ can provide the control current $I_{CTRL}$ to the superconducting circuit device 802 based on an amplitude of the load current $I_{LD}$.

As an example, the current control element 806 can correspond to the current control element 200 in the example of FIG. 2. Therefore, the current control element 806 can be arranged such that the load inductor $L_{LD}$ is coupled to one of the terminals 202 and 204 to provide the series arrangement of the current control element 806 and the load inductor $L_{LD}$. Similar to as described previously, the current control element 806 includes an array of RF SQUIDs arranged to conduct the load current $I_{LD}$. In the example of FIG. 8, the current control element 806 receives the bias current $I_{BIAS}$ that has an amplitude that can control an amount of flux of the RF SQUID array of the current control element 806, such as to control the inductance of the current control element 806. Therefore, the current control element 806 and the load inductor $L_{LD}$ can conduct the load current $I_{LD}$ having an amplitude that can correspond to the amplitude of the control current $I_{CTRL}$ provided to the superconducting circuit device 802. For example, when the current control element 806 is unbiased (e.g., the bias current $I_{BIAS}$ having an approximately zero amplitude), the current control element 806 and load inductor $L_{LD}$ can provide a maximum current amplitude to the load inductor $L_{LD}$ (e.g., the second line 604 of the example of FIG. 6), and can provide a minimum current amplitude to the load inductor $L_{LD}$ (e.g., the first line 602 of the example of FIG. 6) when maximally biased.

Figure 9:
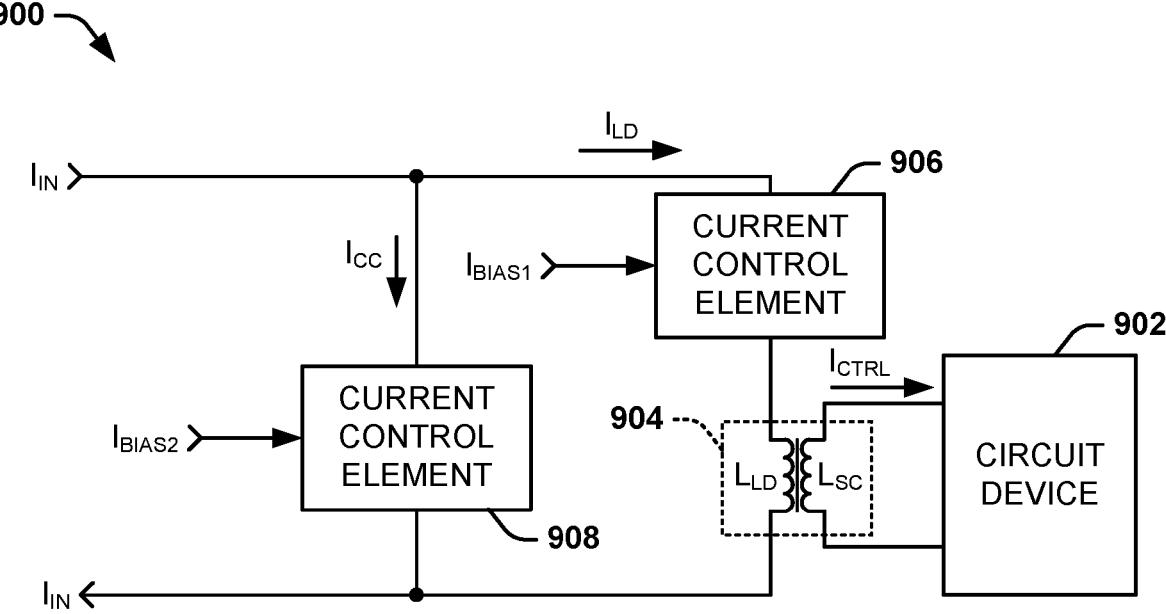
FIG. 9 illustrates yet another example of a superconducting current control system.

FIG. 9 illustrates an example of a superconducting current control system 900. The superconducting current control system 900 can be implemented in any of a variety of classical and superconducting computer systems that may require providing a control current $I_{CTRL}$ to a superconducting circuit device 902, such as during calibration of the superconducting circuit device 902.

In the example of FIG. 9, the superconducting current control system 900 receives an input current $I_{IN}$ that can have a static current amplitude. The superconducting current control system 900 includes an inductive coupler 904, demonstrated in the example of FIG. 9 as a transformer includes a load inductor $L_{LD}$ and a control inductor $L_{SC}$ arranged with a mutual inductance with respect to each other. The superconducting current control system 900 also includes a first current control element 906 that is demonstrated in the example of FIG. 9 as being arranged in series with the load inductor $L_{LD}$. The superconducting current control system 900 further includes a second current control element 908 that is arranged in parallel with the series arrangement of the current control element 906 and the load inductor $L_{LD}$. Therefore, the second current control element 908 is configured to conduct a current $I_{CC}$ that corresponds to a second portion of the input current $I_{IN}$, and the series arrangement of the current control element 906 and the load inductor $L_{LD}$ is configured to conduct a load current $I_{LD}$ that is a first portion of the input current $I_{IN}$ (e.g., such that the sum of the current $I_{CC}$ and the load current $I_{LD}$ is approximately equal to the input current $I_{IN}$). As a result, the control inductor $L_{SC}$ can provide the control current $I_{CTRL}$ to the superconducting circuit device 902 based on an amplitude of the load current $I_{LD}$.

As an example, the first current control element 906 and the second current control element 908 can each correspond to the current control element 200 in the example of FIG. 2. Therefore, each of the first and second current control elements 906 and 908 include an array of RF SQUIDs, such that the first current control element 906 is arranged to conduct the load current $I_{LD}$ and the second current control element 908 is arranged to conduct the current $I_{CC}$.

In the example of FIG. 9, the first current control element 906 receives a first bias current $I_{BIAS1}$ that has an amplitude that can control an amount of flux of the RF SQUID array of the first current control element 906, such as to control the inductance of the first current control element 906. Therefore, the first current control element 906 and the load inductor $L_{LD}$ can conduct the load current $I_{LD}$ having an amplitude that can correspond to the amplitude of the control current $I_{CTRL}$ provided to the superconducting circuit device 902. For example, when the first current control element 906 is unbiased (e.g., the bias current $I_{BIAS}$ having an approximately zero amplitude), the first current control element 906 and load inductor $L_{LD}$ can provide a maximum current amplitude to the load inductor $L_{LD}$ (e.g., the second line 604 of the example of FIG. 6), and can provide a minimum current amplitude to the load inductor $L_{LD}$ (e.g., the first line 602 of the example of FIG. 6) when maximally biased.

Similarly, the second current control element 908 receives a second bias current $I_{BIAS2}$ that has an amplitude that can control an amount of flux of the RF SQUID array of the second current control element 908, such as to control the inductance of the second current control element 908. Therefore, the second current control element 908 can conduct the load current $I_{CC}$ to divert the second portion of the input current $I_{IN}$ from the series arrangement of the first current control element 906 and the load inductor $L_{LD}$. For example, the first bias current $I_{BIAS1}$ and the second bias current $I_{BIAS2}$ can be inversely proportional to provide inverse flux of the RF SQUID array of the first and second current control elements 906 and 908 with respect to each other. Accordingly, the superconducting current control system 900 in the example of FIG. 9 can achieve a higher dynamic range of the load current $I_{LD}$, and thus the control current $I_{CTRL}$.

Figure 10:
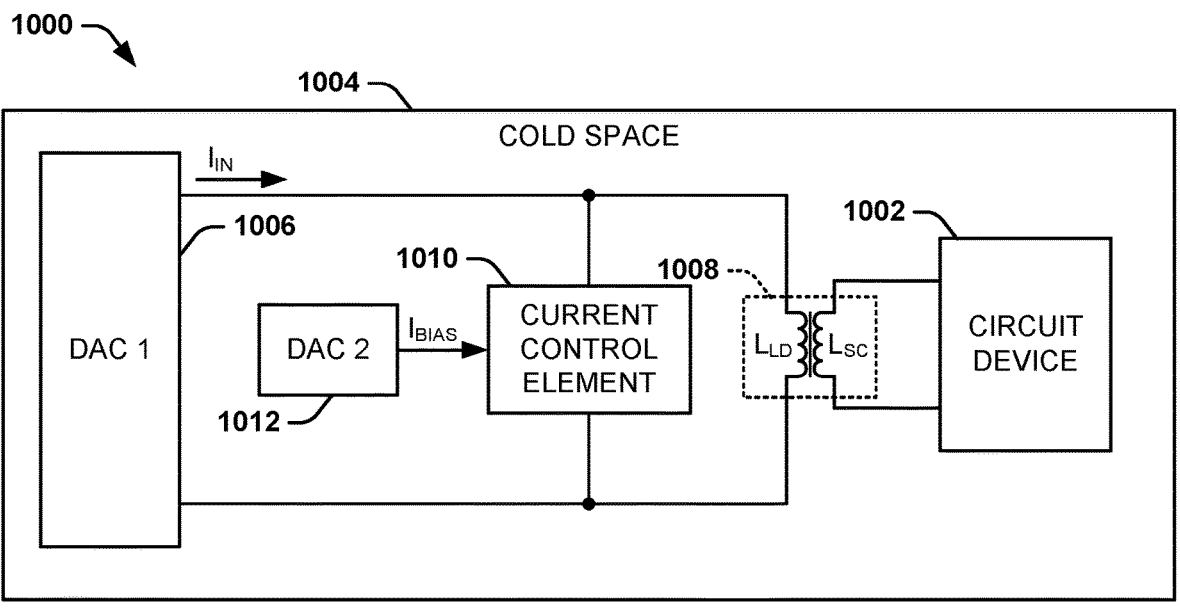
FIG. 10 illustrates yet another example of a superconducting current control system.

FIG. 10 illustrates an example of a superconducting current control system 1000. The superconducting current control system 1000 can be implemented in any of a variety of classical and superconducting computer systems that may require providing a control current $I_{CTRL}$ to a superconducting circuit device 1002, such as during calibration of the superconducting circuit device 1002.

In the example of FIG. 10, the superconducting current control system 1000 is demonstrated as being provided in a superconducting cold space 1004, such that the ambient operational temperature of the superconducting current control system 1000 can be less than approximately 10 Kelvin. The superconducting current control system 1000 includes a first DAC 1006 that is configured to generate an input current $I_{IN}$. The superconducting current control system 1000 includes an inductive coupler 1008, demonstrated in the example of FIG. 10 as a transformer includes a load inductor $L_{LD}$ and a control inductor $L_{SC}$ arranged with a mutual inductance with respect to each other. The superconducting current control system 1000 also includes a current control element 1010 that is demonstrated in the example of FIG. 10 as being arranged in parallel with the load inductor $L_{LD}$. Therefore, similar to as described above in the example of FIG. 7, the current control element 1010 is configured to conduct a second portion of the input current $I_{IN}$, demonstrated as a current $I_{CC}$, and the load inductor $L_{LD}$ is configured to conduct a load current $I_{LD}$ that is a first portion of the input current $I_{IN}$ (e.g., such that the sum of the current $I_{CC}$ and the load current $I_{LD}$ is approximately equal to the input current $I_{IN}$). As a result, the control inductor $L_{SC}$ can provide the control current $I_{CTRL}$ to the superconducting circuit device 1002 based on an amplitude of the load current $I_{LD}$.

As an example, the current control element 1010 can correspond to the current control element 200 in the example of FIG. 2. Therefore, the current control element 1010 can be arranged such that the opposite ends of the load inductor $L_{LD}$ can be coupled to the respective terminals 202 and 204 to provide the parallel arrangement between the current control element 1010 and the load inductor $L_{LD}$. Similar to as described previously, the current control element 1010 includes an array of RF SQUIDs arranged to conduct the current $I_{CC}$ to control the amplitude of the load current $I_{LD}$. In the example of FIG. 10, the current control element 1010 receives a bias current $I_{BIAS}$ that has an amplitude that can control an amount of flux of each of the SQUIDs in the RF SQUID array of the current control element 1010, such as to control the inductance of the current control element 1010.

In the example of FIG. 10, the bias current $I_{BIAS}$ is generated by a second DAC 1012. As described above in the example of FIG. 2, each of the SQUIDs in the SQUID array 110 can be inductively coupled to a bias line that provides the bias current $I_{BIAS}$ from the second DAC 1012. Therefore, the bias current $I_{BIAS}$ can be inductively provided to each individual SQUID of the SQUID array of the current control element 1010. As a result, the bias current $I_{BIAS}$ can be provided at a very small amplitude to provide sufficient tuning of the inductance of the inductive path provided by the current control element 1010. Therefore, as demonstrated in the example of FIG. 10, based on the small amplitude of the bias current $I_{BIAS}$, the second DAC 1012 can be included on the same integrated circuit (IC) as the current control element 1010, such that both the current control element 1010 and the second DAC 1012 can be included in the superconducting cold space 1004.

As an example, a current control element in a conventional superconducting current control system is tuned at a single inductive connection to one or more SQUIDS, which can require a significantly large bias current amplitude. Such a larger bias current amplitude for tuning a current control element thus necessitates providing the bias current from the "room temperature" space outside of the superconducting cold space, which can add additional complexity and cost to the fabrication of the superconducting current control system, as well as additional power consumption. However, by inductively providing the bias current $I_{BIAS}$ to each individual SQUID of the SQUID array of the current control element 1010, the amplitude of the bias current $I_{BIAS}$ enables generation of the bias current $I_{BIAS}$ in the superconducting cold space 1004, thereby mitigating cost, complexity, and power consumption of the superconducting current control system 1000 relative to conventional designs.

Figure 11:
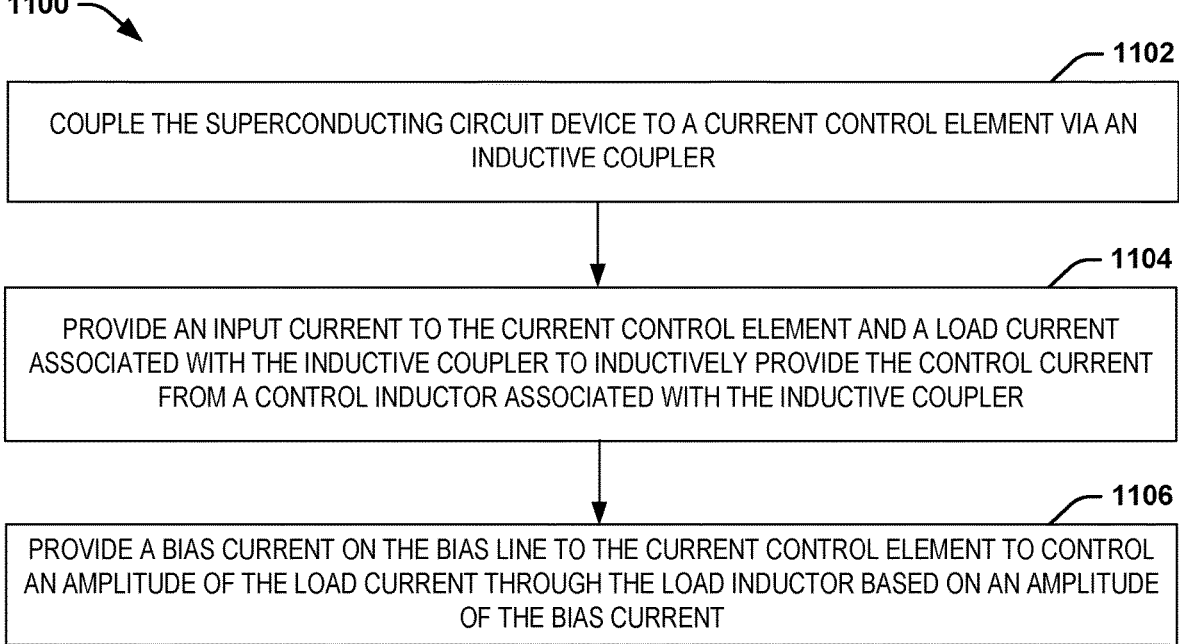
FIG. 11 illustrates an example of a method for controlling an amplitude of a control current provided to a superconducting circuit device.

In view of the foregoing structural and functional features described above, a methodology in accordance with various aspects of the disclosure will be better appreciated with reference to FIG. 11. FIG. 11 illustrates an example of a method 1100 for controlling an amplitude of a control current provided to a superconducting circuit device. It is to be understood and appreciated that the method of FIG. 11 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 1102, the superconducting circuit device (e.g., the superconducting circuit device 102) is coupled to a current control element (e.g., the current control element 108) via an inductive coupler (e.g., the inductive coupler 104), the current control element comprising a SQUID array (e.g., the SQUID array 110) comprising a plurality of RF SQUIDs (e.g., the SQUIDs 208). Each of the SQUIDs can be inductively coupled to a bias line (e.g., the bias line 210). At 204, an input current (e.g., the input current $I_{IN}$) is provided to the current control element and a load current (e.g., the load current $I_{LD}$) associated with a load inductor (e.g., the load inductor $L_{LD}$) of the inductive coupler to inductively provide the control current (e.g., the control current $I_{CTRL}$) from a control inductor (e.g., the control inductor $L_{SC}$) associated with the inductive coupler. At 206, a bias current (e.g., the bias current $I_{BIAS}$) is provided on the bias line to the current control element to control an amplitude of the load current through the load inductor based on an amplitude of the bias current.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting current control system comprising:
an inductive coupler comprising a load inductor and a control inductor, the inductive coupler being configured to inductively provide a control current from the control inductor to a superconducting circuit device based on a load current being provided through the load inductor; and
a current control element comprising a superconducting quantum interference device (SQUID) array comprising a plurality of SQUIDs, each of the SQUIDs being inductively coupled to a bias line, the current control element being configured as a tunable inductive path for an input current corresponding to at least a portion of the load current, the bias line being configured to conduct a bias current to control an amplitude of the input current, the amplitude of the input current being configured to control an amplitude of the load current through the load inductor based on an amplitude of the bias current to thereby control an amplitude of the control current to the superconducting circuit device.

2. The system of claim 1, wherein the plurality of SQUIDs are arranged as a plurality of radio frequency (RF) SQUIDs arranged in an array between a first terminal of the SQUID array and a second terminal of the SQUID array through which the input current is conducted, wherein at least one of the first and second terminals is conductively coupled to the inductive coupler.

3. The system of claim 1, wherein each of the plurality of SQUIDs comprises a Josephson junction and an inductor opposite the Josephson junction that is inductively coupled to the bias line, wherein the SQUIDs are arranged in an alternating pattern with respect to the respective Josephson junction and the respective inductor.

4. The system of claim 3, wherein the inductor associated with each of the SQUIDs is a first inductor, each of the SQUIDs comprising a second inductor, the second inductor interconnecting the respective one of the SQUIDs and a previous one of the SQUIDs in the array to provide flux to the respective one of the SQUIDs and the previous one of the SQUIDs in response to an input current, the load current being a portion of the input current.

5. The system of claim 1, wherein a first portion of the input current is provided as the load current through the load inductor and a second portion of the input current is provided in parallel with the first portion.

6. The system of claim 1, wherein the superconducting current control system receives an input current at an input, wherein a first portion of the input current is provided as the load current through the load inductor and a second portion of the input current is provided in parallel with the first portion.

7. The system of claim 6, wherein the current control element is arranged in parallel with the load inductor, wherein the current control element provides a tunable inductive path for the second portion of the input current to control an amplitude of the first portion of the input current as the load current through the load inductor.

8. The system of claim 6, wherein the current control element is arranged in series with the load inductor, the superconducting current control system further comprising a shunt inductor in parallel with the series arrangement of the current control element and the load inductor, wherein the second portion of the input current passes through the shunt inductor and wherein the current control element provides a tunable inductive path for the first portion of the input current to control an amplitude of the first portion of the input current as the load current through the load inductor.

9. The system of claim 6, wherein the current control element is a first current control element arranged in series with the load inductor, the superconducting current control system further comprising a second current control element arranged in parallel with the series arrangement of the first current control element and the load inductor, wherein the first current control element provides a tunable inductive path for the first portion of the input current and the second current control element provides a tunable inductive path for the second portion of the input current to control an amplitude of the first portion of the input current as the load current through the load inductor.

10. A method for controlling an amplitude of a control current provided to a superconducting circuit device, the method comprising:

coupling the superconducting circuit device to a current control element via an inductive coupler, the current control element comprising a superconducting quantum interference device (SQUID) array comprising a plurality of radio frequency (RF) SQUIDs, each of the SQUIDs being inductively coupled to a bias line;

providing an input current through the current control element, such that the current control element is configured as a tunable inductive path for the input current, the input current corresponding to at least a portion of a load current, the load current being provided through a load inductor of the inductive coupler to inductively provide the control current from a control inductor associated with the inductive coupler; and providing a bias current on the bias line to control an amplitude of the input current, the amplitude of the input current controlling an amplitude of the load current through the load inductor based on an amplitude of the bias current.

11. The method of claim 10, wherein each of the plurality of SQUIDs comprises a Josephson junction, a first inductor arranged opposite the Josephson junction and inductively coupled to the bias line, and a second inductor, wherein the RF SQUIDs are arranged in an alternating pattern with respect to the respective Josephson junction and the respective first inductor, and wherein the second inductor interconnects the respective one of the RF SQUIDs and a previous one of the RF SQUIDs in the array to provide flux to the respective one of the RF SQUIDs and the previous one of the RF SQUIDs in response to the input currents.

12. The method of claim 9, wherein the inductive coupler is coupled to the current control element via at least one of a first terminal and a second terminal associated with the current control element, the input current being conducted between the first and second terminals, wherein the SQUID array is arranged as a first array of RF SQUIDs and a second array of RF SQUIDs arranged in parallel between the first terminal and the second terminal of the current control element, wherein a first portion of the input current is provided through the first array of RF SQUIDs and a second portion of the input current is provided through the second array of SQUIDs.

13. The method of claim 10, wherein providing the bias current comprises providing the bias current to a transformer associated with the current control element to induce a flux in each of the RF SQUIDs of the SQUID array to control the amplitude of the load current.

14. The method of claim 10, wherein the current control element is arranged in parallel with the load inductor, wherein the current control element provides a tunable inductive path for a first portion of the input current to control an amplitude of a second portion of the input current as the load current through the load inductor.

15. The method of claim 10, wherein the current control element is arranged in series with the load inductor, wherein a current path is arranged in parallel with the series arrangement of the current control element and the load inductor, wherein a first portion of the input current passes through the current path and wherein the current control element provides a tunable inductive path for a second portion of the input current to control an amplitude of the second portion of the input current as the load current through the load inductor.

16. A superconducting current control system comprising:

an inductive coupler comprising a load inductor and a control inductor, the inductive coupler being configured to inductively provide a control current from the control inductor to a superconducting circuit device based on a load current being provided through the load inductor as a first portion of an input current that is received at an input of the superconducting current control system, a second portion of the input current being provided parallel with the first portion; and a current control element comprising a first superconducting quantum interference device (SQUID) array and a second SQUID array arranged in parallel between a first terminal and a second terminal, each of the first and second SQUID arrays comprising a plurality of RF SQUIDs, each of the RF SQUIDs being inductively coupled to a bias line configured to conduct a bias current, the current control element being configured as a tunable inductive path for an input current corresponding to at least a portion of the load current, the bias line being configured to conduct a bias current to control an amplitude of the input current, the amplitude of the input current being configured to control an amplitude of the load current through the load inductor based on an amplitude of the bias current, the current control element being coupled to the inductive coupler via at least one of the first and second terminals to control an amplitude of the load current through the load inductor based on an amplitude of the bias current, the control current having an amplitude that is based on the amplitude of the load current.

17. The system of claim 16, wherein each of the plurality of SQUIDs comprises a Josephson junction, a first inductor arranged opposite the Josephson junction and inductively coupled to the bias line, and a second inductor, wherein the RF SQUIDs are arranged in an alternating pattern with respect to the respective Josephson junction and the respective first inductor, and wherein the second inductor interconnects the respective one of the RF SQUIDs and a previous one of the RF SQUIDs in the array to provide flux to the respective one of the RF SQUIDs and the previous one of the RF SQUIDs in response to the input currents.

18. The system of claim 16, wherein the current control element is arranged in parallel with the load inductor, wherein the current control element provides a tunable inductive path for the second portion of the input current to control an amplitude of the first portion of the input current as the load current through the load inductor.

19. The system of claim 16, wherein the current control element is arranged in series with the load inductor, the superconducting current control system further comprising a current path in parallel with the series arrangement of the current control element and the load inductor, wherein the second portion of the input current passes through the current path and wherein the current control element provides a tunable inductive path for the first portion of the input current to control an amplitude of the second portion of the input current as the load current through the load inductor.

\*    \*    \*    \*    \*